(12) United States Patent
Liu et al.

(10) Patent No.: US 10,162,455 B2
(45) Date of Patent: Dec. 25, 2018

(54) FPC OF A CAPACITIVE TOUCHSCREEN AND A METHOD FOR MOUNTING THE FPC

(71) Applicant: KUNSHAN VISIONOX DISPLAY CO., LTD., Kunshan, Jiangsu (CN)

(72) Inventors: Weiwei Liu, Jiangsu (CN); Yao Hong, Jiangsu (CN)

(73) Assignee: Kunshan Visionox Display Co., Ltd., Kunshan, Jiangsu (CN)

( * ) Notice: Subject to any disclaimer, the term of this patent is extended or adjusted under 35 U.S.C. 154(b) by 275 days.

(21) Appl. No.: 15/107,294

(22) PCT Filed: Dec. 23, 2014

(86) PCT No.: PCT/CN2014/094619
§ 371 (c)(1),
(2) Date: Jun. 22, 2016

(87) PCT Pub. No.: WO2015/096690
PCT Pub. Date: Jul. 2, 2015

(65) Prior Publication Data
US 2017/0003801 A1 Jan. 5, 2017

(30) Foreign Application Priority Data

Dec. 24, 2013 (CN) .......................... 2013 1 0721854

(51) Int. Cl.
*H05K 1/02* (2006.01)
*H05K 1/14* (2006.01)
(Continued)

(52) U.S. Cl.
CPC ............ *G06F 3/0416* (2013.01); *G06F 3/044* (2013.01); *H05K 1/028* (2013.01); *H05K 1/189* (2013.01);
(Continued)

(58) Field of Classification Search
CPC ........ H05K 1/028; H05K 1/147; H05K 1/189; H05K 2201/055; H05K 2201/10681; H05K 3/0416; H05K 1/044
See application file for complete search history.

(56) References Cited

U.S. PATENT DOCUMENTS 5,748,448 A * 5/1998 Hokari ................ H01L 31/0203
174/541
2010/0220496 A1 9/2010 Kim
(Continued)

FOREIGN PATENT DOCUMENTS

CN 201234403 Y 5/2009
CN 202425189 U 9/2012
(Continued)

OTHER PUBLICATIONS

International Preliminary Report on Patentability for related PCT app No. PCT/CN2014/094619 dated Jun. 28, 2016.
(Continued)

*Primary Examiner* — Hoa C Nguyen
(74) *Attorney, Agent, or Firm* — Womble Bond Dickinson (US) LLP

(57) ABSTRACT

An FPC of a capacitive touchscreen and a method for mounting the FPC. The FPC comprises a sensing circuit and a driving circuit which respectively matches with a sensing circuit layer and a driving circuit layer of a capacitive touchscreen panel and have several contacts for matching the sensing circuit layer and the driving circuit layer for corresponding connection; an IC driving chip, disposed between the sensing circuit and the driving circuit. The sensing circuit and the driving circuit are disposed in parallel or on the same line. The sensing circuit or the driving circuit is provided with a bending area, and the sensing circuit or the driving circuit is able to be turned towards the driving circuit or the sensing circuit, so as to allow the sensing
(Continued)

circuit to match the sensing circuit layer and allow the driving circuit to match the driving circuit layer. According to the present invention, the FPCs of the capacitive touchscreen can be compactly arranged on a substrate, so that the utilization rate of the substrate is greatly increased and the cost is reduced.

10 Claims, 5 Drawing Sheets

(51) Int. Cl.
  *G06F 3/041* (2006.01)
  *G06F 3/044* (2006.01)
  *H05K 1/18* (2006.01)
(52) U.S. Cl.
  CPC .... *G06F 2203/04102* (2013.01); *H05K 1/147* (2013.01); *H05K 2201/052* (2013.01); *H05K 2201/055* (2013.01); *H05K 2201/10128* (2013.01); *H05K 2201/10681* (2013.01)

(56) References Cited

U.S. PATENT DOCUMENTS

| | | | |
|---|---|---|---|
| 2011/0037717 A1 | 2/2011 | Yeh et al. | |
| 2012/0146919 A1* | 6/2012 | Kim | G06F 3/044 345/173 |
| 2012/0294556 A1 | 11/2012 | Kurimura | |
| 2012/0299963 A1* | 11/2012 | Wegrzyn | G07F 17/16 345/633 |
| 2014/0176819 A1* | 6/2014 | Yilmaz | G06F 1/1692 349/12 |
| 2014/0218629 A1* | 8/2014 | Chuang | G02F 1/13338 349/12 |
| 2014/0218630 A1* | 8/2014 | Kang | G06F 3/044 349/12 |
| 2015/0092120 A1* | 4/2015 | Wang | G06F 3/041 349/12 |

FOREIGN PATENT DOCUMENTS

| | | |
|---|---|---|
| CN | 202617497 U | 12/2012 |
| CN | 102946690 A | 2/2013 |
| CN | 102968212 A | 3/2013 |
| EP | 0 735 405 A2 | 3/1996 |
| EP | 2 254 396 A1 | 5/2009 |
| JP | 62-289815 | 12/1987 |
| JP | 6-43472 | 2/1994 |
| JP | H06-43472 | 2/1994 |
| JP | 2008-134975 | 6/2008 |
| JP | 2012-151352 | 8/2012 |
| TW | 1392927 B1 | 4/2013 |
| TW | M452389 U1 | 5/2013 |

OTHER PUBLICATIONS

Supplemental European Search Report for app No. 14875332 dated Nov. 16, 2016.
English translation of JP 2008-134975 specification.
English translation of JP 62-289815 specification.
English translation of JP 6-43472 specification.
English translation of JP 2012-151352 specification.
English translation of TW M452389 U1 abstract.
Office Action for JP 2016-543200 dated Apr. 17, 2017.
Notification of Reasons for Refusal for JP 2016-543200 dated Nov. 6, 2017, with English translation.
Decision of Refusal for JP 2016-543200 dated Mar. 28, 2018, with English translation.
Office Action for TW 10520338510 dated Mar. 24, 2016.

* cited by examiner

FPC OF A CAPACITIVE TOUCHSCREEN AND A METHOD FOR MOUNTING THE FPC

FIELD OF THE INVENTION

The invention relates to flexible circuit board design field, especially relates to an FPC of a capacitive touchscreen and a method for mounting the FPC.

BACKGROUND ART

The structure of a capacitive touchscreen in prior art shown in FIG. 1 mainly comprises a capacitive touchscreen panel 1' and a flexible circuit board 2', the flexible circuit board 2' is covered by a cover board 3'. Wherein, the capacitive touchscreen panel (sensor) comprises an insulating transparent substrate, a sensing circuit layer and a driving circuit layer. The insulating transparent substrate is made of glass or plastic film; the sensing circuit layer is formed by a transparent conductive film having a sensing circuit or glass; the driving circuit layer is formed by transparent conductive film having driving circuit or glass, and the driving circuit layer and the sensing circuit layer are respectively arranged on both sides of the insulating transparent substrate. The flexible circuit board, called soft board or FPC (Flexible Printed Circuit) for short, is a superexcellent flexible printed circuit board produced by polyimide or polyester film as a substrate, which has high reliability and has characteristics of free bending, strong bending performance, free folding, free winding, anti-slitting, high wiring density, light weight, thin thickness, etc.

The structure of an FPC of the capacitive touchscreen in prior art is shown in FIG. 2, in which the flexible circuit board 2' comprises a sensing circuit 5' and a driving circuit 6' which respectively match a sensing circuit layer and a driving circuit layer of a capacitive touchscreen panel 1', the sensing circuit 5' is arranged perpendicular to the driving circuit 6', the sensing circuit 5' and driving circuit 6' have several contacts 9' for matching the sensing circuit layer and the driving circuit layer for corresponding connection. The sensing circuit 5' and the driving circuit 6' have an IC driving chip 4' disposed therebetween, which has a communication end 8' for communicating with communication devices such as mobile phones. The sensing circuit 5' and the driving circuit 6' are respectively laminated with the sensing circuit layer and the driving circuit layer of a capacitive touchscreen panel 1' and connected therewith, and allow the corresponding contacts to connect with each other. While such an FPC is being cut on the substrate 7', as shown in FIG. 3, since the sensing circuit 5' is perpendicular to the driving circuit 6', this arrangement may occupy a large space, which is not in favor of making a compact arrangement and may waste substrate, so as to cause a high cost.

SUMMARY OF THE INVENTION

Thus, the present invention is to solve the problem that the FPC of the capacitive touchscreen of prior art may occupy a large space, which is not in favor of making a compact arrangement, so as to waste substrate, lower the utilization rate of a substrate and cause a high cost, thereby providing an FPC of a capacitive touchscreen that is able to be arranged on the substrate in a compact manner, achieve a high utilization rate of a substrate and save the cost, and also provide a method of mounting the FPC, To solve the above mentioned problem, the present invention provides A FPC of a capacitive touchscreen, comprises a sensing circuit and a driving circuit, which respectively match with a sensing circuit layer and a driving circuit layer of a capacitive touchscreen panel and have several contacts for matching the sensing circuit layer and the driving circuit layer for corresponding connection; an IC driving chip, disposed between the sensing circuit and the driving circuit; wherein, the sensing circuit and the driving circuit are disposed in parallel or on the same line; the sensing circuit or the driving circuit is provided with a bending area, and the sensing circuit or the driving circuit is able to be turned towards the driving circuit or the sensing circuit, so as to allow the sensing circuit to match the sensing circuit layer and allow the driving circuit to match the driving circuit layer, a bending portion is located in the bending area after being turned over.

Preferably, side lines of the sensing circuit and the driving circuit, where the contacts are provided, are located on the same line.

Preferably, the bending area is arranged on the driving circuit and close to the IC driving chip.

Preferably, the contacts are not located in the bending area.

Preferably, the side lines of the sensing circuit and driving circuit, where no contact is provided, are located on different lines.

Preferably, after the sensing circuit or driving circuit are turned over, the sensing circuit is perpendicular to the driving circuit.

The present invention also discloses a method for mounting the FPC mentioned above to a capacitive touchscreen, includes Step 1: laminating the sensing circuit or driving circuit of the FPC together with the corresponding sensing circuit layer or driving circuit layer of a capacitive touchscreen panel of a capacitive touchscreen;

Step 2: turning the driving circuit or sensing circuit which is not laminated in the direction perpendicular to the sensing circuit or driving circuit, and a bending portion generated by turning is located in the bending area;

Step 3: laminating the turned driving circuit or the sensing circuit together with the corresponding driving circuit layer or sensing circuit layer of capacitive touchscreen panel together, so as to complete assembling of the FPC.

Preferably, comprises a step of flattening the sensing circuit and the driving circuit, prior to the step 1.

Preferably, side lines of the sensing circuit and the driving circuit, where the contacts are provided, are located on the same line; and side lines of the sensing circuit and driving circuit, where no contact is provided, are located on different lines.

Preferably, the bending area is arranged on the driving circuit and close to the IC driving chip.

Compared with prior art, the technical proposal of the invention has advantage of that:

(1) According to the FPC of the capacitive touchscreen of the invention, the sensing circuit and the driving circuit are disposed in parallel or located on the same line, the sensing circuit or the driving circuit can be turned towards the driving circuit or the sensing circuit, so that the sensing circuit matches the sensing circuit layer and the driving circuit matches the driving circuit layer. Since the FPC circuit board has characteristics of free bending, folding, wrapping, anti-slitting etc., after lamination, the FPC can be freely arranged according to the internal space of the product, which is like a conducting wire. This will not affect the normal use of the product; meanwhile, the FPC with such arrangement can save space, so as to achieve a compact arrangement on the substrate while being cut, so that the utilization rate of a substrate is greatly increased by approximately 160%, and the cost is greatly reduced.

(2) According to the FPC of a capacitive touchscreen of the invention, the side lines of the sensing circuit and the driving circuit having the contacts are located on the same line, so as to make the structure of the product regular and easy to cut, meet the requirements of the capacitive touchscreen, and ensure reliable contact among the contacts.

(3) According to the FPC of a capacitive touchscreen of the invention, the bending area is arranged on the driving circuit and close to the IC driving chip, the FPC with such arrangement is easy to bend, and the bending FPC can meet the requirements of the product, the product quality is ensured.

(4) According to the FPC of a capacitive touchscreen of the invention, the contacts are not provided in the bending area; on one hand, since the bending area is not necessary to contact the sensing circuit layer and driving circuit layer of the capacitive touchscreen panel, no contact is arranged, which may avoid of wasting of material and save the cost; on the other hand, the bending area without contacts arranged therein is in favor of bending operation.

(5) According to the FPC of a capacitive touchscreen of the invention, simply turning the driving circuit or sensing circuit in the direction perpendicular to the sensing circuit or driving circuit can let the FPC meet the requirements of the capacitive touchscreen products, this turning is easy to operate and the cost is reduced.

BRIEF DESCRIPTION OF THE DRAWINGS

To be easier to clearly understand, the specific embodiments of the present invention will be further described in details with figures, wherein.

NUMERAL REFERENCE IN FIGURES IS AS FOLLOWS

1'—capacitive touchscreen, 2, 2'—FPC (flexible circuit board), 3, 3'—cover board, 4, 4'—IC driving chip, 5, 5'—sensing circuit, 6, 6'—driving circuit, 7—substrate , 8—communication end, 9, 9'—contacts, 10—bending area, 11—bending portion.

DETAILED DESCRIPTION

Figure 1:
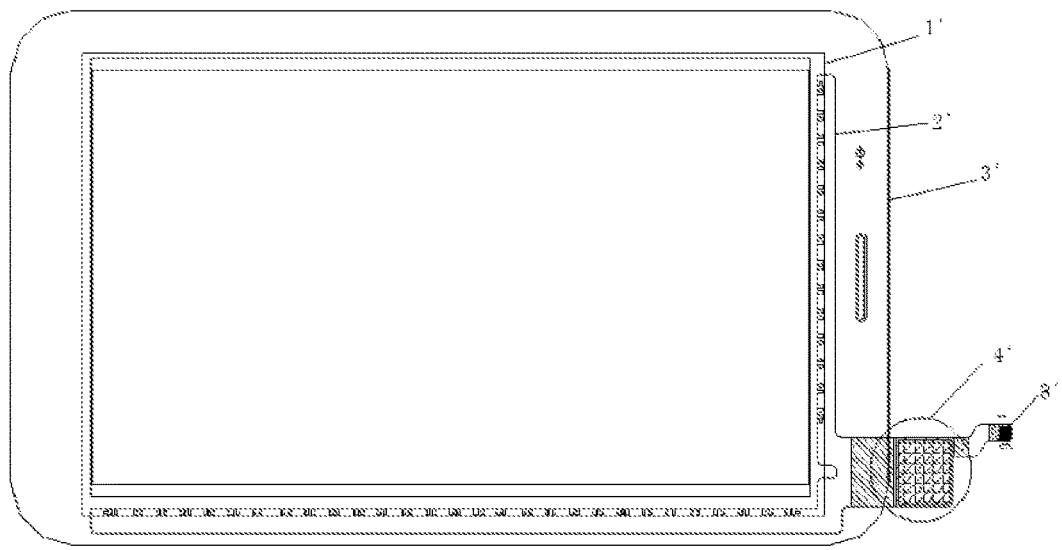
FIG. 1 is a schematic diagram of the capacitive touchscreen of prior art.
Figure 2:
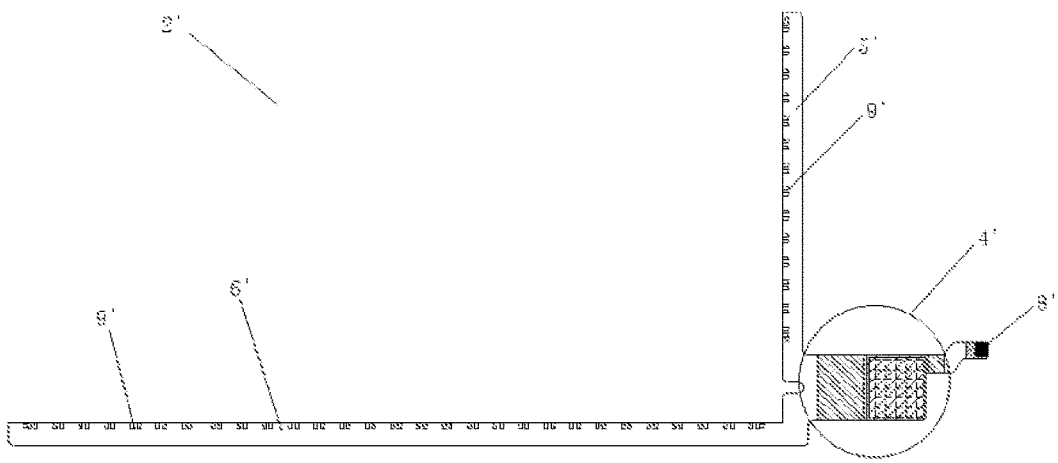
FIG. 2 is a structural schematic diagram of the FPC of a capacitive touchscreen in prior art.
Figure 3:
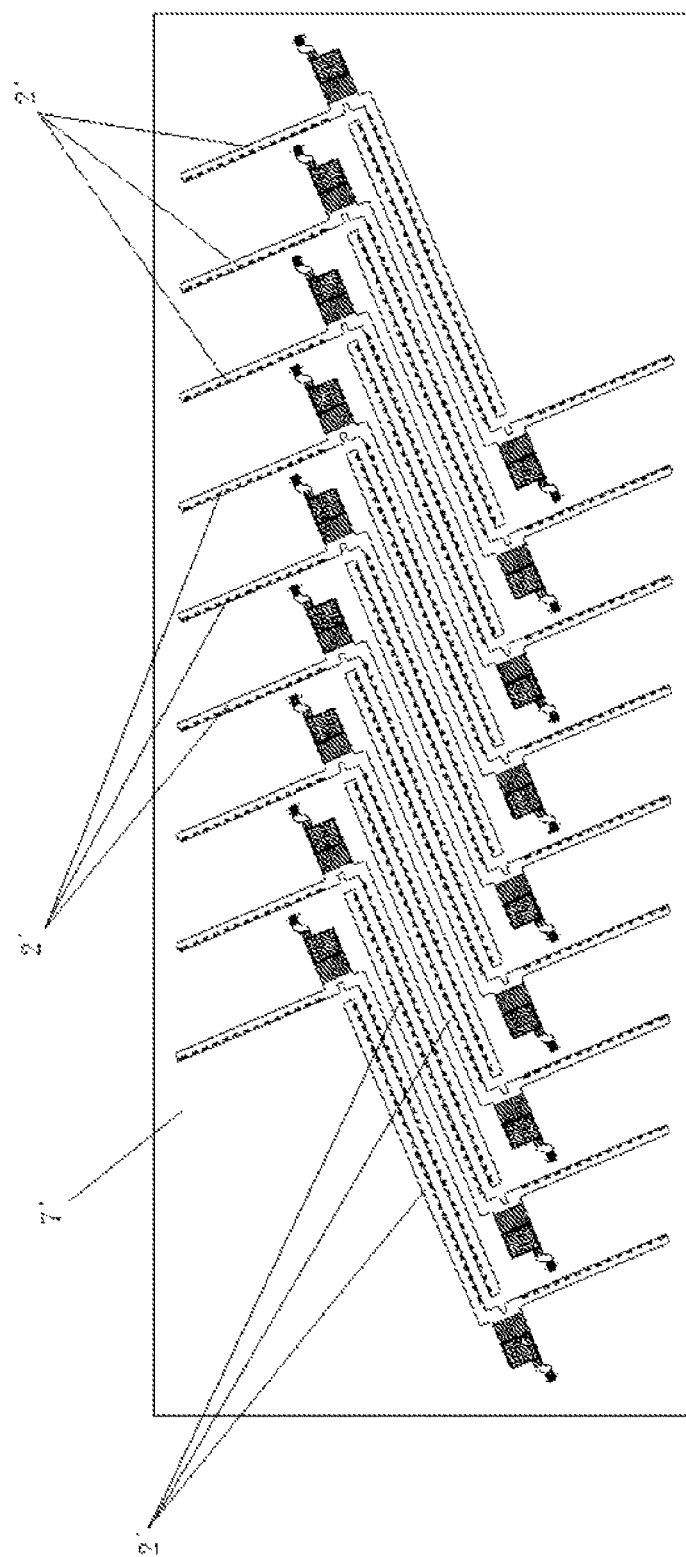
FIG. 3 is a schematic diagram showing the arrangement of the FPC of a capacitive touchscreen on the substrate of prior art.
Figure 4:
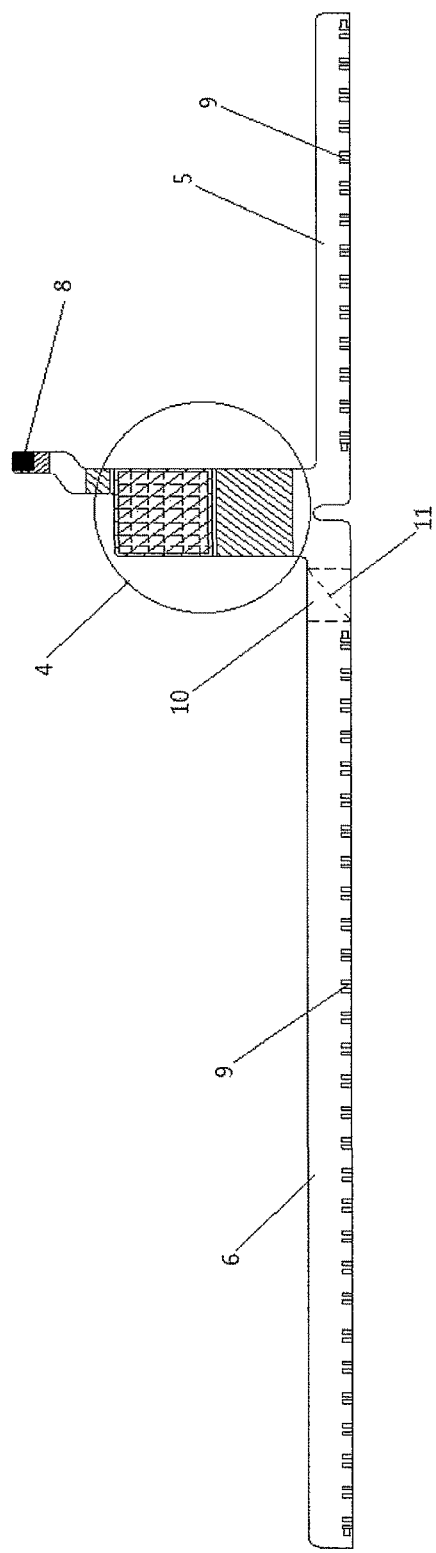
FIG. 4 is a structural schematic diagram of the FPC of a capacitive touchscreen of the invention.

A preferable embodiment of the FPC of a capacitive touchscreen of the invention is shown in FIG. 4, FPC (Flexible Printed Circuit), i.e. flexible circuit board, is called soft board for short.

The FPC 2 comprises a sensing circuit 5 and a driving circuit 6 which respectively matches with a sensing circuit layer and a driving circuit layer of a capacitive touchscreen panel and have several contacts 9 for matching the sensing circuit layer and the driving circuit layer for corresponding connection; an IC driving chip 4 disposed between the sensing circuit 5 and the driving circuit 6, which has a communication end 8 for communicating with communication devices such as mobile phones.

Figure 5:
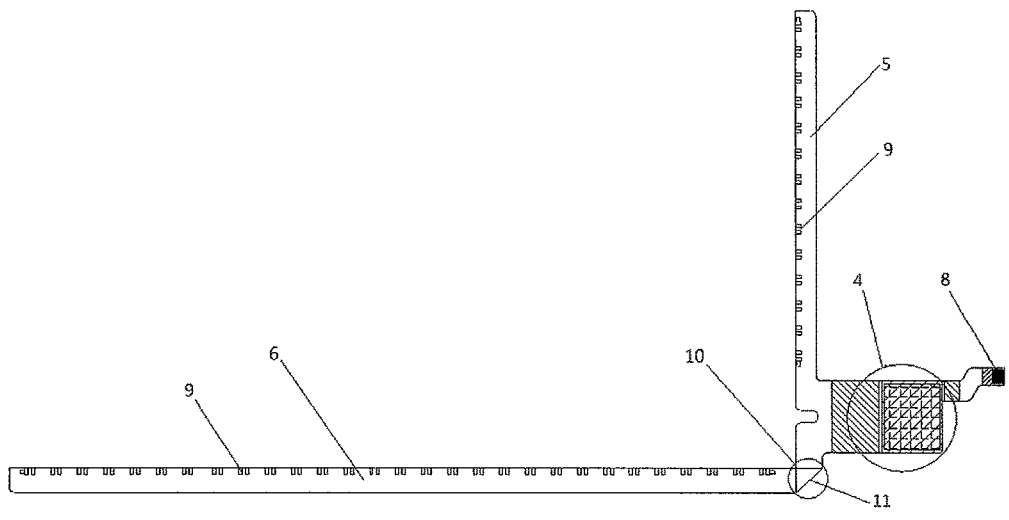
FIG. 5 is a structural schematic diagram of the bending FPC of a capacitive touchscreen of the invention.

The sensing circuit 5 and the driving circuit 6 are disposed in parallel or on the same line. The sensing circuit 5 or the driving circuit 6 is provided with a bending area 10 arranged in a position near the IC driving chip 4 on the driving circuit 6. The contacts 9 are not in the bending area 10. The sensing circuit 5 or the driving circuit 6 is able to be turned towards the driving circuit 6 or the sensing circuit 5, so as to allow the sensing circuit 5 to match the sensing circuit layer and allow the driving circuit 6 to match the driving circuit layer, a bending portion 11 is located in the bending area 10 after being turned over, as shown in FIG. 5. In the present embodiment, the bending sensing circuit 5 arranged in Y direction is perpendicular to the driving circuit 6 arranged in X direction.

Figure 6:
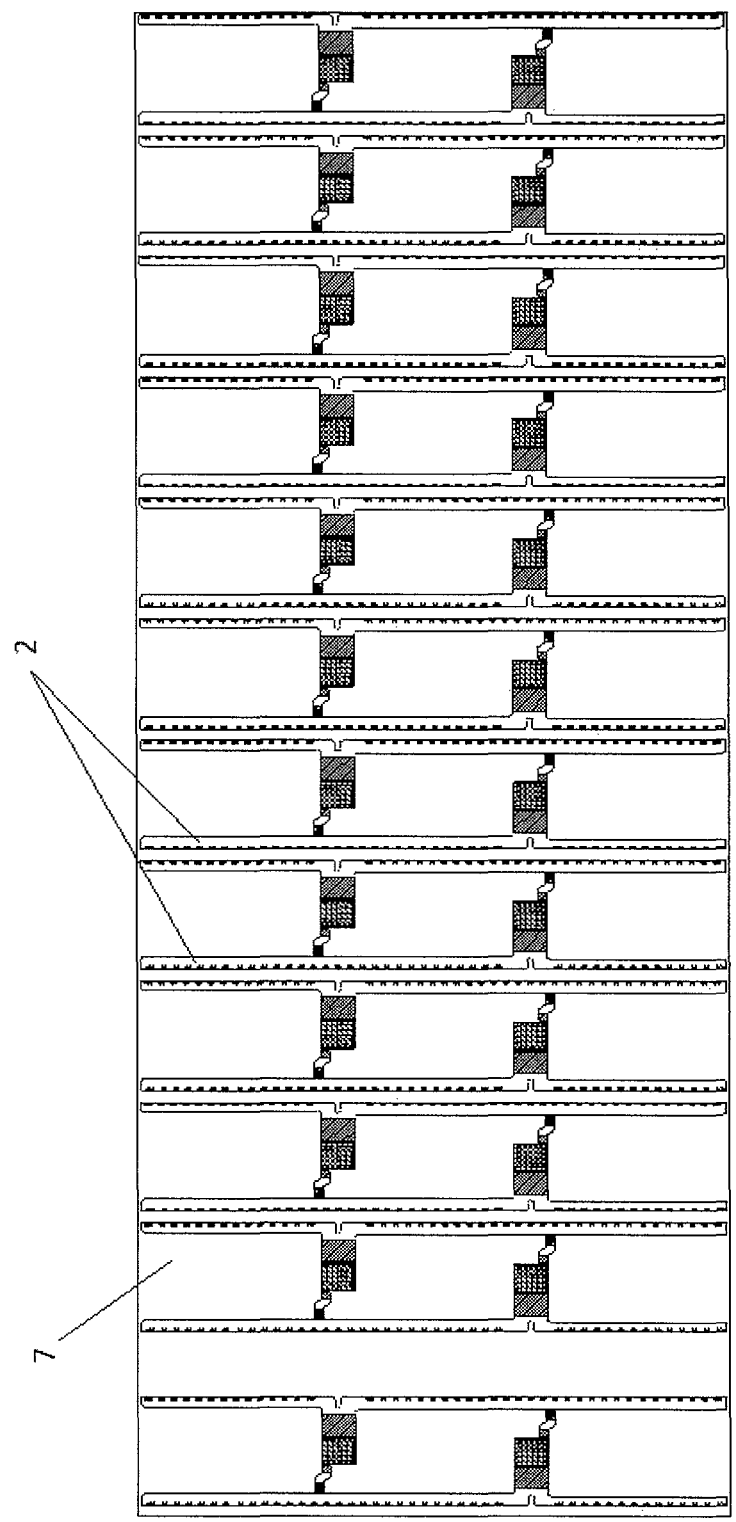
FIG. 6 is a schematic diagram showing the arrangement of the FPC of a capacitive touchscreen on the substrate of the invention.

In the present embodiment, side lines of the sensing circuit 5 and driving circuit 6 where all contacts 9 are provided, are located on the same line, and side lines where no contacts 9 are provided are located on different lines. As shown in FIG. 6, when being cut, the FPC of capacitive touchscreen of the invention occupies little space and is arranged compactly on the substrate 7, so that the utilization rate of the substrate is greatly increased and the cost is reduced.

The method for mounting the FPC to a capacitive touchscreen includes

Step 1: laminating the sensing circuit 5 or driving circuit 6 of the FPC together with the corresponding sensing circuit layer or driving circuit layer of the capacitive touchscreen panel of the capacitive touchscreen, wherein, the driving circuit 6 and the sending circuit layer of the capacitive touchscreen are preferably firstly laminated together;

step 2: turning over the driving circuit 6 or sensing circuit 5 which is not laminated in the direction perpendicular to the sensing circuit 5 or driving circuit 6, and a bending portion 11 is located in the bending area 10 after being turned over; wherein, in the present embodiment, preferably, the sensing circuit 5 and the driving circuit 6 is flat enough, the sensing circuit 5 which has not been laminated is turned towards the direction perpendicular to the driving circuit 6 and the bending portion 11 is located in the bending area 10 after being turned over.

Step 3: laminating the turned driving circuit 6 or the sensing circuit 5 together with the corresponding driving circuit layer or sensing circuit layer of capacitive touchscreen panel, so as to complete assembling of the FPC, wherein, in the present embodiment, preferably, the turned sensing circuit 5 and the corresponding driving circuit layer of capacitive touchscreen panel are laminated together, so as to complete assembling of the FPC.

As alternative embodiments, the method further comprises a step of flattening the sensing circuit 5 and the driving circuit 6 prior to the step 1, so as to try to locate the sensing circuit 5 and the driving circuit 6 on the same surface.

In other embodiments, the location of the sensing circuit 5 and the driving circuit 6 is determined by the sample figure of the sensor panel design of different products, in other words, after being bent, the sensing circuit 5 also can be arranged in X direction as required, and the driving circuit 6 also can be arranged in Y direction.

In other embodiments, according to the actual requirements of the products, bending area 10 also can be arranged on the sensing circuit 5 and close to the IC driving chip 4, as long as the actual requirements of the products can be met.

Obviously, the above-described embodiments are only examples for clear description, and are not restriction of the mode of enforcement. For ordinary skill men in the field, other changes can be made in different forms on the basis of the above description. There is no need to explain all embodiments here. And the apparent changes or variations still drop the protection scope of the invention.

The invention claimed is:

1. A FPC of a capacitive touchscreen, comprising
a sensing circuit and a driving circuit, which respectively matches with a sensing circuit layer and a driving circuit layer of a capacitive touchscreen panel and have several contacts for matching the sensing circuit layer and the driving circuit layer for corresponding connection;
an IC driving chip, disposed between the sensing circuit and the driving circuit;
characterized in that, the sensing circuit and the driving circuit are disposed in parallel or on the same line; the sensing circuit or the driving circuit is provided with a bending area, and the sensing circuit or the driving circuit is able to be turned towards the driving circuit or the sensing circuit, so as to allow the sensing circuit to match the sensing circuit layer and allow the driving circuit to match the driving circuit layer, a bending portion is located in the bending area after being turned over.

2. The FPC of a capacitive touchscreen according to claim 1, characterized in that, side lines of the sensing circuit and the driving circuit, where the contacts are provided, are located on the same line.

3. The FPC of a capacitive touchscreen according to claim 2, characterized in that, the bending area is arranged on the driving circuit and close to the IC driving chip.

4. The FPC of a capacitive touchscreen according to claim 3, characterized in that, the contacts are not located in the bending area.

5. The FPC of a capacitive touchscreen according to claim 4, characterized in that, the side lines of the sensing circuit and driving circuit, where no contact is provided, are located on different lines.

6. The FPC of a capacitive touchscreen according to claim 1, characterized in that, after the sensing circuit or driving circuit are turned over, the sensing circuit is perpendicular to the driving circuit.

7. A method for mounting the FPC of claim 1 to a capacitive touchscreen, characterized in including
Step 1: laminating the sensing circuit or driving circuit of the FPC together with the corresponding sensing circuit layer or driving circuit layer of a capacitive touchscreen panel of a capacitive touchscreen;
Step 2: turning the driving circuit or sensing circuit which is not laminated in the direction perpendicular to the sensing circuit or driving circuit, and a bending portion generated by turning is located in the bending area;
Step 3: laminating the turned driving circuit or the sensing circuit together with the corresponding driving circuit layer or sensing circuit layer of capacitive touchscreen panel together, so as to complete assembling of the FPC.

8. The method for mounting according to claim 7, characterized in comprising a step of flattening the sensing circuit and the driving circuit, prior to the step 1.

9. The method for mounting according to claim 8, characterized in that, side lines of the sensing circuit and the driving circuit, where the contacts are provided, are located on the same line; and side lines of the sensing circuit and driving circuit, where no contact is provided, are located on different lines.

10. The method for mounting according to claim 9, characterized in that, the bending area is arranged on the driving circuit and close to the IC driving chip.

* * * * *